US009985590B2

(12) United States Patent
Tseng et al.

(10) Patent No.: US 9,985,590 B2
(45) Date of Patent: May 29, 2018

(54) ADAPTIVE POWER AMPLIFIER SUPPLY WITH PRE-DISTORTION MECHANISM

(71) Applicant: MediaTek Inc., Hsin-Chu (TW)

(72) Inventors: Po-Sen Tseng, Hsinchu County (TW); Wei-Kai Chang, Taipei (TW); I-No Liao, Hsinchu County (TW); Tzyuan Shiu, Taipei (TW); Hsin-Hung Chen, Hsinchu (TW); Caiyi Wang, Austin, TX (US)

(73) Assignee: MediaTek Inc., Hsin-Chu (TW)

( * ) Notice: Subject to any disclaimer, the term of this patent is extended or adjusted under 35 U.S.C. 154(b) by 0 days. days.

(21) Appl. No.: 15/374,992

(22) Filed: Dec. 9, 2016

(65) Prior Publication Data

US 2017/0214370 A1 Jul. 27, 2017

Related U.S. Application Data

(60) Provisional application No. 62/313,160, filed on Mar. 25, 2016, provisional application No. 62/287,484, filed on Jan. 27, 2016.

(51) Int. Cl.
*H04B 1/04* (2006.01)
*H03F 1/32* (2006.01)
(Continued)

(52) U.S. Cl.
CPC ........... *H03F 1/3247* (2013.01); *H03F 1/025* (2013.01); *H03F 1/0222* (2013.01);
(Continued)

(58) Field of Classification Search
CPC ...... H03F 1/3247; H03F 1/0222; H03F 3/245; H04B 1/04; H04L 27/2614; H04W 52/365
(Continued)

(56) References Cited

U.S. PATENT DOCUMENTS 6,314,142 B1 11/2001 Perthold et al.
6,703,897 B2 3/2004 O'Flaherty et al.
(Continued)

OTHER PUBLICATIONS

Extended European Search Report for Application No. 17153402.7 dated May 26, 2017.
(Continued)

*Primary Examiner* — Sanh Phu
(74) *Attorney, Agent, or Firm* — Wolf, Greenfield & Sacks, P.C.

(57) ABSTRACT

According to at least one aspect, a communication system is provided. The communication system includes a power amplifier configured to amplify an input signal to generate an amplified output signal and provide the amplified output signal to an antenna, a power supply coupled to the power amplifier and configured to provide power to the power amplifier based on a power supply control signal, and a controller coupled to the power supply. The controller is configured to identify a target transmit power level for transmission of a wireless signal, generate the power supply control signal based on the target transmit power level using information indicative of a relationship between the target transmit power level and a setting of the power supply, generate performance information indicative of a characteristic of the communication system when the wireless signal is transmitted, and update the information indicative of the relationship using the performance information.

17 Claims, 3 Drawing Sheets

(51) Int. Cl.
- *H03F 1/02* (2006.01)
- *H03F 3/24* (2006.01)
- *H04L 27/26* (2006.01)
- *H04W 52/36* (2009.01)
- *H03F 3/189* (2006.01)

(52) U.S. Cl.
CPC ......... *H03F 1/0255* (2013.01); *H03F 1/3282* (2013.01); *H03F 3/189* (2013.01); *H03F 3/245* (2013.01); *H04B 1/04* (2013.01); *H04L 27/2614* (2013.01); *H04W 52/365* (2013.01); *H04B 2001/0425* (2013.01)

(58) Field of Classification Search
USPC ...................................................... 455/114.3
See application file for complete search history.

(56) References Cited

U.S. PATENT DOCUMENTS

| | | |
|---|---|---|
| 7,026,868 B2 | 4/2006 | Robinson et al. |
| 7,091,777 B2 | 8/2006 | Lynch |
| 9,369,094 B2 * | 6/2016 | Matsumoto ........... H03F 1/0211 |
| 2010/0105343 A1 | 4/2010 | Stebbings et al. |
| 2013/0257529 A1 | 10/2013 | Komninakis et al. |
| 2015/0145600 A1 | 5/2015 | Hur et al. |
| 2016/0072457 A1 * | 3/2016 | Subrahmaniyan Radhakrishnan ..... H03F 1/0211 375/219 |

OTHER PUBLICATIONS

EP 17153402.7, dated May 26, 2017, Extended European Search Report.

\* cited by examiner

ADAPTIVE POWER AMPLIFIER SUPPLY
WITH PRE-DISTORTION MECHANISM

CROSS-REFERENCE TO RELATED
APPLICATIONS

This application claims priority to U.S. provisional application Ser. No. 62/287,484 titled "ADAPTIVE POWER AMPLIFIER SUPPLY WITH PREDISTORTION MECHANISM," filed on Jan. 27, 2016 and to U.S. provisional application Ser. No. 62/313,160 titled "ADAPTIVE POWER AMPLIFIER SUPPLY WITH PRE-DISTORTION MECHANISM," filed Mar. 25, 2016, each of which is hereby incorporated herein by reference in its entirety.

BACKGROUND

1. Technical Field

The techniques described herein relate to techniques to improve the power efficiency of a power amplifier, such as a power amplifier in a communication system.

2. Discussion of the Related Art

Wireless transmitters typically include power amplifiers to amplify signals to an appropriate level for wireless transmission via an antenna. These power amplifiers consume power to amplify input signals. The power consumed by these power amplifiers may change based on the current operating conditions. Wireless transmitters typically include a power supply to provide power to these power amplifiers at a fixed voltage level (e.g., 10 volts). The magnitude of the fixed voltage level is typically selected to be higher than the supply voltage required by the power amplifier under the worst expected operating conditions.

SUMMARY

According to at least one aspect, a communication system is provided. The communication system includes a power amplifier configured to amplify an input signal to generate an amplified output signal and provide the amplified output signal to an antenna, a power supply coupled to the power amplifier and configured to provide power to the power amplifier based on a power supply control signal, and a controller coupled to the power supply. The controller is configured to identify a target transmit power level for transmission of a wireless signal, generate the power supply control signal based on the target transmit power level using information indicative of a first relationship between the target transmit power level and at least one setting of the power supply, generate performance information indicative of at least one characteristic of the communication system when the wireless signal is transmitted, and update the information indicative of the first relationship using the performance information.

In some embodiments, the at least one setting of the power supply includes at least one of: a supply voltage provided to the power amplifier and a supply current provided to the power amplifier. In some embodiments, the performance information includes at least one of: a voltage headroom of the power amplifier when the wireless signal is transmitted and an output power of the power amplifier when the wireless signal is transmitted.

In some embodiments, the communication system further includes a predistortion filter coupled to the power amplifier and configured to generate a predistorted signal by predistorting a baseband signal to compensate for distortion to be introduced by the power amplifier. In some embodiments, the controller is further configured to generate a predistortion control signal and provide the predistortion control signal to the predistortion filter to adjust at least one parameter of the predistortion filter. In some embodiments, the communication system further includes an upconverter coupled between the predistortion filter and the power amplifier and being configured to increase a frequency of the predistorted signal to generate the input signal for the power amplifier.

In some embodiments, the communication further includes a downconverter coupled between the power amplifier and the controller and being configured to generate a feedback signal indicative of the amplified output signal and provide the feedback signal to the controller. In some embodiments, the controller is further configured to generate the performance information based on feedback signal. In some embodiments, the controller is further configured to determine an output power of the power amplifier when the wireless signal is transmitted based on the feedback signal.

In some embodiments, the controller is further configured to determine whether the wireless signal is being transmitted and provide the power supply control signal to the power supply responsive to a determination that a wireless signal is not being transmitted.

In some embodiments, the controller is configured to identify at least one characteristic of a baseband signal to be transmitted and generate the power supply control signal based on the target transmit power level and the identified at least one characteristic of the baseband signal using information indicative of a second relationship between the identified at least one characteristic of the baseband signal and the at least one setting of the power supply. In some embodiments, the at least one characteristic of the baseband signal includes a peak-to-average power ratio of the baseband signal and the controller is further configured to receive the baseband signal and determine the peak-to-average power ratio of the baseband signal.

According to at least one aspect, a method of operating a communication system is provided. The method includes identifying a target transmit power level for transmission of a wireless signal, adjusting a power supply for a power amplifier based on the target transmit power level using information indicative of a first relationship between the target transmit power level and at least one setting of the power supply, wirelessly transmitting the wireless signal, generating performance information indicative of at least one characteristic of the communication system when the wireless signal is transmitted, and updating the information indicative of the first relationship using the performance information.

In some embodiments, wirelessly transmitting the wireless signal includes receiving a baseband signal to be wirelessly transmitted, predistorting the baseband signal to generate a predistorted signal and compensate for distortion to be introduced by the power amplifier, increasing a frequency of the predistorted signal to generate an upconverted signal, amplifying the upconverted signal to generate an amplified signal, and providing the amplified signal to an antenna.

In some embodiments, adjusting the power supply includes adjusting at least one of: a supply voltage of the power supply to the power amplifier and a supply current of the power supply to the power amplifier. In some embodiments, adjusting the power supply includes adjusting the power supply during a gap period where a wireless signal is not being transmitted. In some embodiments, generating the performance information includes determining at least one of: an output power of the power amplifier when the wireless signal is transmitted and an amount of voltage headroom of the power amplifier when the wireless signal is transmitted.

In some embodiments, the method further includes identifying at least one characteristic of a baseband signal to be transmitted. In some embodiments, adjusting the power supply includes adjusting the power supply based on the target transmit power level and the identified at least one characteristic of the baseband signal using information indicative of a second relationship between the identified at least one characteristic of the baseband signal and the at least one setting of the power supply. In some embodiments, identifying the at least one characteristic of the baseband signal to be transmitted includes identifying a peak-to-average power ratio of the baseband signal.

According to at least one aspect, a communication system is provided. The communication system includes a power amplifier configured to amplify an input signal to generate an amplified output signal and provide the amplified output signal to an antenna, a downconverter coupled to the power amplifier and configured to generate a feedback signal indicative of the amplified output signal, a power supply coupled to the power amplifier and configured to provide power to the power amplifier based on a power supply control signal, and a controller coupled to the power supply and the downconverter. The controller is configured to receive the feedback signal indicative of the amplified output signal, identify a target transmit power level for transmission of a wireless signal, and generate the power supply control signal based on the target transmit power level and the feedback signal.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

Conventional wireless transmitters provide a fixed supply voltage to power amplifiers that is sufficiently high to keep the power amplifier from clipping the output signal under the worst operating conditions. This fixed supply voltage, however, may be well above the supply voltage required by the power amplifier under numerous other operating conditions. The present inventors have appreciated that the power efficiency of a power amplifier may be improved by changing the supply voltage provided to the power amplifier based on the particular operating conditions. Accordingly, aspects of the present disclosure relate to communication systems and associated methods that adjust a power supply for an amplifier using information indicative of relationships between identified parameters associated with a wireless transmission to be performed, such as a target transmit power for transmission of a wireless signal, and settings of the power supply, such as a supply voltage level. Further, the communication system may collect performance information when the wireless signal is transmitted and use the collected performance information to fine tune these relationships. Thereby, the performance of the communication system may improve over time as more wireless signals are transmitted.

Figure 1:
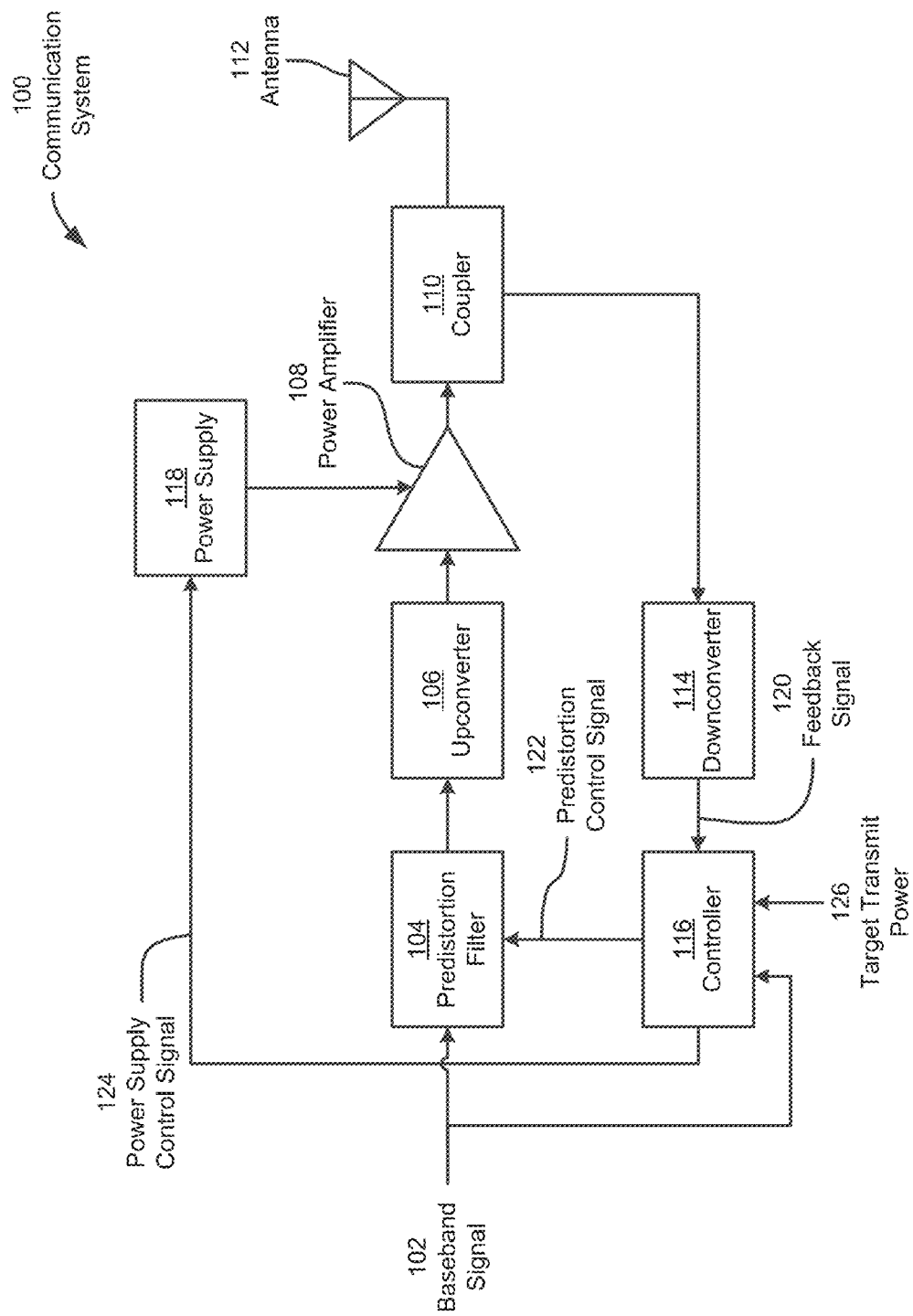
FIG. 1 shows a diagram of a communication system, according to some embodiments.

FIG. 1 shows a diagram of a communication system 100 that adjusts a power supply for a power amplifier to improve the power efficiency of the power amplifier. As shown, the communication system 100 receives a baseband signal 102 and transmits a wireless signal using the baseband signal 102 via an antenna 112. The communication system 100 includes a predistortion filter 104 that receives the baseband signal 102 and predistorts the baseband signal 102 to compensate for distortion to be added by components of the communication system 100. The predistorted signal from the predistortion filter 104 is increased in frequency (e.g., upconverted) by the upconverter 106. A power amplifier 108 amplifies the upconverted signal from the upconverter 106 and receives power from a power supply 118. The amplified signal from the power amplifier 108 is provided to a coupler 110 that provides the amplified signal to the antenna 112 and provides a coupled signal to a downconverter 114. The downconverter 114 decreases a frequency of the coupled signal from the coupler 110 to generate a feedback signal 120 that is provided to a controller 116. The controller 116 receives a target transmit power 126 in addition to the baseband signal 102 and the feedback signal 120. The controller 116 uses the baseband signal 102, the target transmit power 126, and/or the feedback signal 120 to generate a predistortion control signal 122 that controls the predistortion filter 104 and a power supply control signal 124 that controls the power supply 118.

The predistortion filter 104 filters the baseband signal 102 to generate a predistorted signal. The predistortion filter 104 may adjust one or more characteristics of the baseband signal 102 to reduce (or cancel out) distortion to be introduced by components of the communication system 100, such as the power amplifier 108. The predistortion filter 104 may adjust, for example, an amplitude and/or a phase of the baseband signal 102. In some embodiments, the predistortion filter 104 may be a configurable filter that is controlled based on the predistortion control signal 122. For example, the predistortion filter 104 may adjust a phase shift and/or an amplitude adjustment applied to the baseband signal 102 based on the predistortion control signal 122 received from the controller 116.

The upconverter 106 increases a frequency of the predistorted signal received from the predistortion filter 104 to generate an upconverted signal. For example, the upconverter 106 may include a mixer that multiplies the predistorted signal with a radio frequency signal to increase a frequency of the predistorted signal. The upconverter 106 may increase the frequency of the predistorted signal to a frequency that is in the radio spectrum (e.g., between 3 Hertz and 3000 (gigahertz).

The power amplifier 108 amplifies the upconverted signal from the upconverter 106 to generate an amplified signal. The power amplifier 108 may receive power from the power supply 118. For example, the power supply 118 may provide a supply voltage and a supply current to the power amplifier 108. The power supply 118 may adjust the supply voltage and/or the supply current provided to the power amplifier 108 based on the power supply control signal 124.

The coupler 110 receives the amplified signal from the power amplifier 108, provides the amplified signal to the antenna 112, and provides a coupled signal to the downconverter 114. The coupled signal may be indicative of the amplified signal and be at a lower power level than the amplified signal. For example, the coupler 110 may be constructed to provide a majority of the input power (e.g., more than 50%) from the power amplifier 108 to the antenna 112. In these embodiments, the portion of the input power provided to the downconverter 114 may be smaller than the portion of the input power provided to the antenna 112.

The downconverter 114 decreases a frequency of the coupled signal from the coupler 110 to generate the feedback signal 120. For example, the downconverter 106 may include a mixer that multiplies the coupled signal with a radio frequency signal to decrease a frequency of the coupled signal.

The controller 116 controls the power supply 118 to increase a power efficiency, of the power amplifier 108 and controls the predistortion filter 104 to reduce (or cancel) distortion introduced by components of the communication system 100. The controller 116 may include, for example, a microcontroller (or other suitable processing device) to generate the predistortion control signal 122 and the power supply control signal 124 based on various received and/or determined parameters. In some embodiments, the controller 116 may adjust the power supply 118 and/or the predistortion filter 104 prior to a wireless transmission based on information regarding the wireless transmission such as a target transmit power 126 for the wireless transmission and/or a peak-to-average power ratio of the baseband signal 102 to be transmitted. For example, the controller 116 may include a memory storing information indicative of relationships between the parameters associated with the wireless transmission to be performed and settings for the power supply 118. The controller 116 may store the relationship in memory as, for example, a lookup table. In this example, the controller 116 may use these relationships to generate the power supply control signal 124. It should be appreciated that the stored relationships may not be direct relationships between parameters associated with the wireless transmission to be performed and the settings for the power supply 118. For example, information indicative of a relationship between the target transmit power 126 and the supply voltage may be a relationship between the target transmit power 126 and a desired amount of voltage headroom that is employed, in turn, to determine the supply voltage.

In some embodiments, the controller 116 may generate performance information when the wireless signal is transmitted and update the relationships stored in memory, based on the generated performance information. For example, the controller 116 may identify a voltage level of the output signal of the power amplifier 108 during a transmission based on the feedback signal 120 and also identify the supply voltage provided to the power amplifier 108 during the transmission. In this example, the controller 116 may identify the amount of voltage headroom in the power amplifier 108 by comparing the output voltage of the power amplifier 108 to the supply voltage provided by the power supply 118. The determined amount of voltage headroom may be compared with a desired amount of voltage headroom to determine whether the amount of voltage headroom was above a minimum threshold. If the amount of headroom is below the minimum threshold, the controller 116 may increase the supply voltage for the target transmit power level associated with the transmission. Conversely, the controller 116 may decrease the supply voltage for the target transmit power level associated with the transmission in response to the amount of voltage headroom being above the minimum threshold to improve a power efficiency of the power amplifier 108. Thereby, the controller 116 may fine-tune the relationships stored in memory over time to achieve a desired balance between the power efficiency of the power amplifier 108 and distortion in the wireless transmission.

In some embodiments, the controller 116 may only adjust the predistortion filter 104 and/or the power supply 118 during a gap period where the communication system 100 is not transmitting a wireless signal. For example, the controller 116 may determine whether the communication system 100 is transmitting a wireless signal and adjust the power supply 118 and/or the predistortion filter 104 responsive to a determination that a wireless signal is not being transmitted. Otherwise, the controller 116 may wait for the wireless transmission to be completed. Thereby, the controller 116 may reduce the possibility of distorting the wireless transmission by adjusting the communication system 100 during the wireless transmission.

Figure 2:
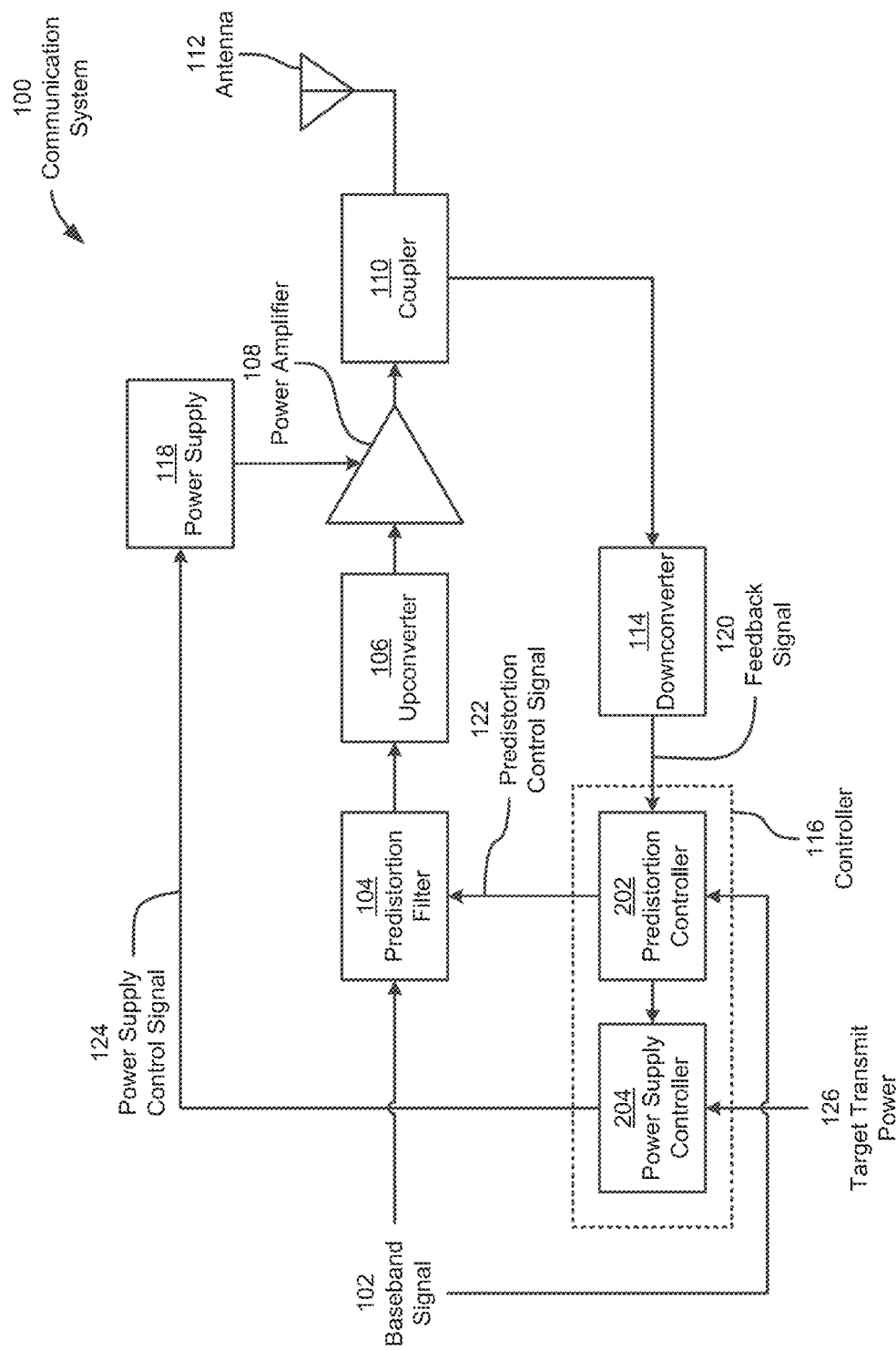
FIG. 2 shows a detailed diagram of a communication system, according to some embodiments.

FIG. 2 shows an example implementation of the controller 116 in the communication system 100. As shown, the controller 116 includes a power supply controller 204 that generates the power supply control signal 124 to control the power supply 118 and a predistortion controller 202 that generates the predistortion control signal 122 to control the predistortion filter 104.

The predistortion controller 202 may receive the feedback signal 120 and the baseband signal 102 and generate the predistortion control signal 122. In some embodiments, the predistortion controller 202 determines various characteristics of the baseband signal 102 and/or the amplified signal provided by the power amplifier 108. For example, the predistortion controller 202 may determine a peak-to-average power ratio of the baseband signal 102 using the received baseband signal 102 and/or an output power of the power amplifier 108 using the feedback signal 120. These determined signal characteristics may be employed to generate the predistortion control signal 122. Further, these determined signal characteristics may be provided to the power supply controller 204 for use in the generation of the power supply control signal 124.

The power supply controller 204 controls the settings of the power supply 118 based on parameters associated with the wireless transmission. In some embodiments, the controller 116 may use information indicative of various relationships stored in memory (e.g., stored as an LUT in memory) to generate the power supply control signal 124. For example, an LUT may be stored in memory and include information indicative of relationships between parameters including the target transmit power 126 and the peak-to-average power ratio of the baseband signal 102 and the supply voltage provided by the power supply 118. In this example, the power supply controller 204 may receive the target transmit power 126 from another component in the communication system 100 and/or from an external system. The power supply controller 204 may receive the peak-to-average power ratio of the baseband signal 102 from the predistortion controller 202. These received parameters may be applied to the LUT to identify the appropriate supply voltage to provide the power amplifier 108. In turn, the power supply controller 204 may generate the power supply control signal 124 to adjust the supply voltage provided by the power supply 118 to the identified supply voltage.

In some embodiments, the power supply controller 204 may generate performance information when the wireless signal is transmitted and update the relationships stored in memory (e.g., by updating entries in an LUT) using the generated performance information. Example performance information that may be generated includes the amount of voltage headroom in the power amplifier 108 when the wireless signal is transmitted and the output power of the power amplifier 108 when the wireless signal is transmitted. For example, the power supply controller 204 may determine the amount of voltage headroom in the power amplifier 108 during transmission of the wireless signal based on the feedback signal 120 and the supply voltage setting provided to the power supply 118 during the wireless transmission. In this example, the power supply controller 204 may compare the determined amount of voltage headroom with a desired amount of voltage headroom (e.g., stored in the LUT). If the determined amount of voltage headroom is different than the desired amount of voltage headroom, the power supply controller 204 may adjust the supply voltage associated with one or more entries in the LUT employed to transmit the wireless signal. It should be appreciated that the power supply controller 204 may also adjust entries proximate the one or more entries in the LUT employed to transmit the wireless signal using interpolation techniques. For example, the power supply controller 204 may have recently updated the power supply settings in a first entry in the LUT for a first target transmit power level and a second entry in the LUT for a second target transmit power level. In this example, the power supply controller 204 may also update the power supply settings in a third entry in the LUT with a third target transmit power level that is between the first and second transmit power levels using interpolation. The controller 116 may also update the power supply settings in a fourth entry in the LUT with a target transmit power level that is outside the first and second transmit power levels using extrapolation.

Figure 3:
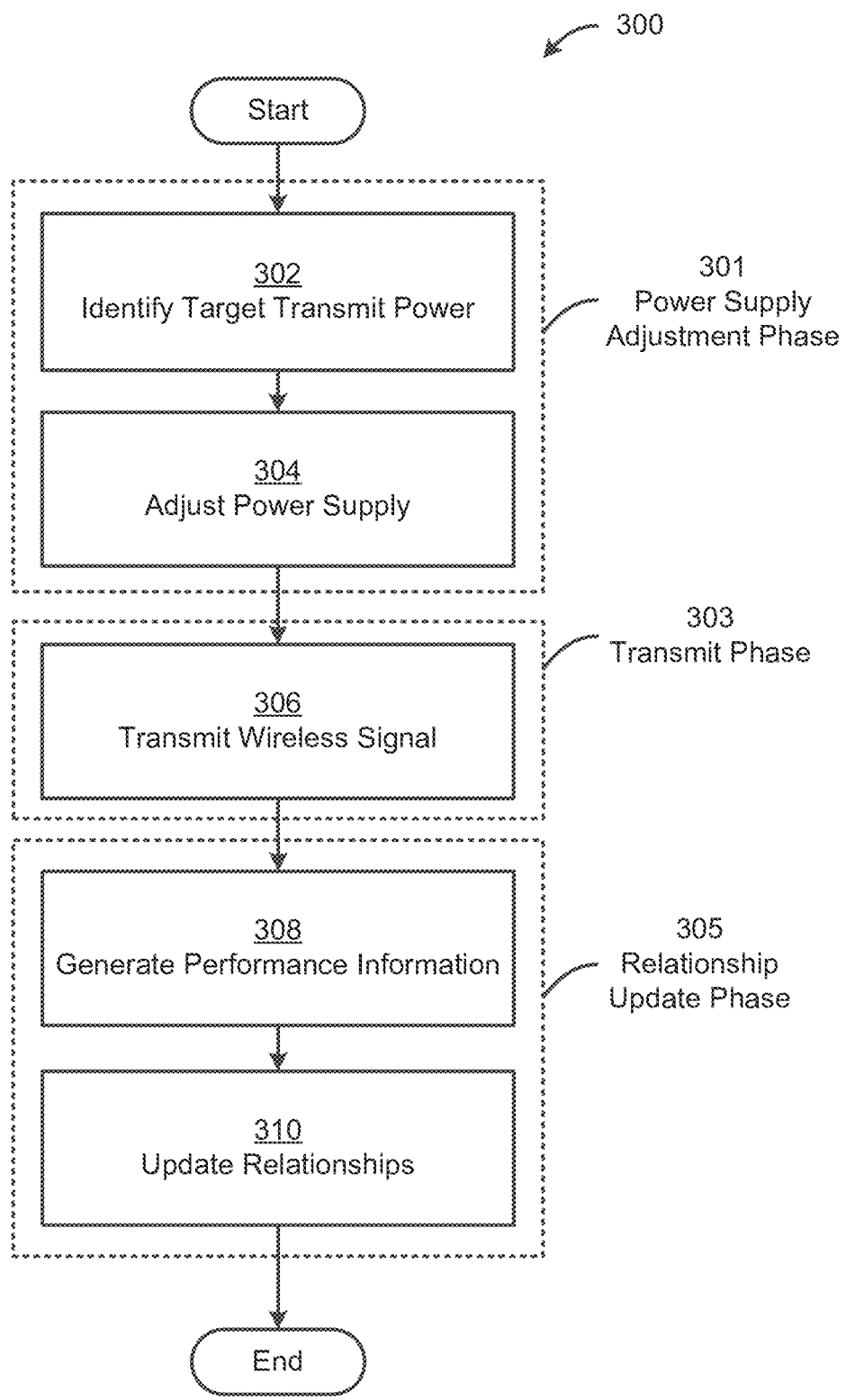
FIG. 3 shows an example method of operating a communication system, according to some embodiments.

An example method of operation for the communication systems disclosed herein is shown in FIG. 3 by method of operation 300. As shown, the method of operation 300 includes a power supply adjustment phase 301 where the settings of the power supply that provides power to the power amplifier is adjusted for the next wireless transmission. The power supply adjust phase 301 includes an act 302 of identifying a target transmit power and an act 304 of adjusting the power supply. A transmit phase 303 follows the power supply adjustment phase 301 where the communication system transmits the wireless signal. The transmit phase 303 includes an act 306 of transmitting the wireless signal. A relationship update phase 305 follows the transmit phase 303 where the communication system updates the relationships stored in memory using generated performance information indicative of at least one characteristic of the communication system when the wireless signal is transmitted. The relationship update phase 305 includes an act 308 of generating the performance information and act 310 of updating the relationships.

In the act 302, the communication system identifies a target transmit power level for transmitting a wireless signal. For example, the communication system may receive the target transmit power level from an external system. In another example, the communication system may generate the target transmit power level internally.

In the act 304, the communication system adjusts the power supply for a power amplifier of the communication system. For example, the communication system may adjust a supply voltage to the power amplifier and/or a supply current to the power amplifier. In some embodiments, the communication system may adjust the power supply based on the identified target transmit power level. In these embodiments, the communication system may determine a setting for the power supply using information indicative of a relationship between the target transmit power level and the settings for the power supply. For example, the relationships may be stored as an LUT that includes a plurality of target transmit power levels and an associated supply voltage and/or supply current setting for the power supply for each of the target transmit power levels. In another example, the relationships may be stored as an LUT that includes a plurality of target power levels and an associated amount of headroom in the power amplifier for each of the target transmit power levels. In this example, the identified amount of headroom in the power amplifier from the LUT may be employed, in turn, to determine the supply voltage and/or supply current settings. It should be appreciated that the communication system may adjust the power supply based on additional parameters. In some embodiments, the communication system may adjust the power supply based on a characteristic of a baseband signal to be transmitted by the communication system such as a peak-to-average power ratio of the baseband signal. In these embodiments, the LUT may also include a plurality of values for the characteristic of the baseband signal and an associated setting for each characteristic.

In some embodiments, the communication system may adjust the power supply for the power amplifier of the communication system during gap periods when the communication system is not transmitting a wireless signal. Adjusting the power supply during gap periods may advantageously reduce the possibility of distorting the signal being amplified by the power amplifier during transmission. In these embodiments, the communication system may determine whether the communication system is transmitting a wireless signal and adjust the power supply responsive to a determination that the communication system is not transmitting a wireless signal. Otherwise, the communication system may wait to adjust the power supply until the transmission has been completed.

In act 306, the communication system transmits the wireless signal. For example, the communication system may receive a baseband signal and transmit a wireless signal based on the received baseband signal. In some embodiments, the communication system may transmit the wireless signal by receiving a baseband signal to be wirelessly transmitted and predistorting the baseband signal to compensate for distortion to be introduced by the power amplifier. The communication system may increase a frequency (e.g., upconvert) the predistorted signal and amplify the predistorted signal using the power amplifier. The amplified signal may be provided to an antenna for wireless transmission.

In act 308, the communication system generates performance information indicative of at least one characteristics of the communication system during transmission of the wireless signal. For example, the communication system may determine an amount of voltage headroom of the power amplifier and/or an output power of the power amplifier. The communication system may also gather information indicative of various settings associated with the transmission such as the target transmit power level associated with the transmission of the wireless signal and/or the peak-to-average power ratio of the baseband signal used in the transmission.

In act 310, the communication system updates the relationships stored in memory using the generated performance information. For example, the communication may update one or more entries in a LUT stored in memory. In some embodiments, the communication system may revise an LUT entry associated with the target transmit power level used during transmission of the wireless signal. For example, an entry in an LUT may include a supply voltage setting associated with a given target transmit power level to achieve a minimum amount of voltage headroom. In this example, the communication system may determine whether the amount of voltage headroom in the generated performance information exceeded the minimum amount of voltage headroom. If the communication system determines that the amount of voltage headroom was less than the predetermined amount of voltage headroom, the communication system may revise the entry to increase a supply voltage of the power amplifier. Conversely, the communication system may revise the entry to decrease the supply voltage if the communication system determines that the amount of voltage headroom was more than the predetermined amount of voltage headroom.

Having described an example method of operation, it should be appreciated that various alternations may be made to the described method without departing from the scope of the present disclosure. For example, various acts may be omitted, combined, repeated, or added. Further, the acts in the method described herein do not need to be performed in the particular order shown.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A communication system comprising:
    a power amplifier configured to amplify an input signal to generate an amplified output signal and provide the amplified output signal to an antenna;
    a power supply coupled to the power amplifier and configured to provide power to the power amplifier based on a power supply control signal; and
    a controller coupled to the power supply and configured to:
        identify a target transmit power level for transmission of a wireless signal;
        identify at least one characteristic of a baseband signal to be transmitted;
        generate the power supply control signal based on the target transmit power level and the identified at least one characteristic of the baseband signal using information indicative of a first relationship between the target transmit power level and at least one setting of the power supply and information indicative of a second relationship between the identified at least one characteristic of the baseband signal and the at least one setting of the power supply;
        generate performance information indicative of at least one characteristic of the communication system when the wireless signal is transmitted; and
        update the information indicative of the first relationship using the performance information.

2. The communication system of claim 1, wherein the at least one setting of the power supply includes at least one of: a supply voltage provided to the power amplifier and a supply current provided to the power amplifier.

3. The communication system of claim 1, wherein the performance information includes at least one of: a voltage headroom of the power amplifier when the wireless signal is transmitted and an output power of the power amplifier when the wireless signal is transmitted.

4. The communication system of claim 1, further comprising a predistortion filter coupled to the power amplifier and configured to generate a predistorted signal by predistorting a baseband signal to compensate for distortion to be introduced by the power amplifier.

5. The communication system of claim 4, wherein the controller is further configured to generate a predistortion control signal and provide the predistortion control signal to the predistortion filter to adjust at least one parameter of the predistortion filter.

6. The communication system of claim 4, further comprising an upconverter coupled between the predistortion filter and the power amplifier and being configured to increase a frequency of the predistorted signal to generate the input signal for the power amplifier.

7. The communication system of claim 1, further comprising a downconverter coupled between the power amplifier and the controller and being configured to generate a feedback signal indicative of the amplified output signal and provide the feedback signal to the controller.

8. The communication system of claim 7, wherein the controller is further configured to generate the performance information based on feedback signal.

9. The communication system of claim 8, wherein the controller is further configured to determine an output power of the power amplifier when the wireless signal is transmitted based on the feedback signal.

10. The communication system of claim 1, wherein the controller is further configured to determine whether the wireless signal is being transmitted and provide the power supply control signal to the power supply responsive to a determination that a wireless signal is not being transmitted.

11. The communication system of claim 1, wherein the at least one characteristic of the baseband signal includes a peak-to-average power ratio of the baseband signal and wherein the controller is further configured to receive the baseband signal and determine the peak-to-average power ratio of the baseband signal.

12. A method of operating a communication system, comprising:
    identifying a target transmit power level for transmission of a wireless signal;
    identifying at least one characteristic of a baseband signal to be transmitted;
    adjusting a power supply for a power amplifier based on the target transmit power level and the identified at least one characteristic of the baseband signal using information indicative of a first relationship between the target transmit power level and at least one setting of the power supply and information indicative of a second relationship between the identified at least one characteristic of the baseband signal and the at least one setting of the power supply;
wirelessly transmitting the wireless signal;
generating performance information indicative of at least one characteristic of the communication system when the wireless signal is transmitted; and
updating the information indicative of the first relationship using the performance information.

13. The method of claim 12, wherein wirelessly transmitting the wireless signal includes:
receiving a baseband signal to be wirelessly transmitted;
predistorting the baseband signal to generate a predistorted signal and compensate for distortion to be introduced by the power amplifier;
increasing a frequency of the predistorted signal to generate an upconverted signal;
amplifying the upconverted signal to generate an amplified signal; and
providing the amplified signal to an antenna.

14. The method of claim 12, wherein adjusting the power supply includes adjusting at least one of: a supply voltage of the power supply to the power amplifier and a supply current of the power supply to the power amplifier.

15. The method of claim 12, wherein adjusting the power supply includes adjusting the power supply during a gap period where a wireless signal is not being transmitted.

16. The method of claim 12, wherein generating the performance information includes determining at least one of: an output power of the power amplifier when the wireless signal is transmitted and an amount of voltage headroom of the power amplifier when the wireless signal is transmitted.

17. The method of claim 12, wherein identifying the at least one characteristic of the baseband signal to be transmitted includes identifying a peak-to-average power ratio of the baseband signal.

* * * * *